United States Patent
Park et al.

(10) Patent No.: US 7,160,744 B2
(45) Date of Patent: Jan. 9, 2007

(54) FABRICATION METHOD OF LIGHT EMITTING DIODE INCORPORATING SUBSTRATE SURFACE TREATMENT BY LASER AND LIGHT EMITTING DIODE FABRICATED THEREBY

(75) Inventors: Young Ho Park, Kyungki-do (KR); Hun Joo Hahm, Kyungki-do (KR); Kun Yoo Ko, Kyungki-do (KR); Hyo Kyong Cho, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 10 days.

(21) Appl. No.: 10/953,815

(22) Filed: Sep. 30, 2004

(65) Prior Publication Data
US 2006/0038190 A1    Feb. 23, 2006

(30) Foreign Application Priority Data
Aug. 17, 2004  (KR) ............... 10-2004-0064535

(51) Int. Cl.
*H01L 21/00* (2006.01)

(52) U.S. Cl. .............. 438/29; 438/665; 438/964

(58) Field of Classification Search ........... 438/29, 438/32, 665, 964, 39; 257/98, 99
See application file for complete search history.

(56) References Cited

U.S. PATENT DOCUMENTS

| | | | |
|---|---|---|---|
| 6,649,440 B1 * | 11/2003 | Krames et al. ............ 438/47 |
| 6,821,804 B1 * | 11/2004 | Thibeault et al. ........... 438/29 |
| 2004/0038049 A1 | 2/2004 | Suzuki et al. | |
| 2004/0048471 A1 | 3/2004 | Okagawa et al. | |
| 2004/0113166 A1 | 6/2004 | Tadatomo et al. | |

FOREIGN PATENT DOCUMENTS

| | | |
|---|---|---|
| JP | 2000-106455 | 4/2000 |
| JP | 2002-164296 | 6/2002 |
| JP | 2002-280609 | 9/2002 |
| JP | 2002-280611 | 9/2002 |

\* cited by examiner

*Primary Examiner*—Sara Crane
(74) *Attorney, Agent, or Firm*—Lowe Hauptman & Berner, LLP.

(57) ABSTRACT

The present invention relates to a fabrication method of LEDs incorporating a step of surface-treating a substrate by a laser and an LED fabricated by such a fabrication method. The present invention can use a laser in order to implement finer surface treatment to an LED substrate over the prior art. As a result, the invention can improve the light extraction efficiency of an LED while protecting the substrate from chronic problems of the prior art such as stress or defects induced from chemical etching and/or physical polishing.

9 Claims, 11 Drawing Sheets

US 7,160,744 B2

FABRICATION METHOD OF LIGHT EMITTING DIODE INCORPORATING SUBSTRATE SURFACE TREATMENT BY LASER AND LIGHT EMITTING DIODE FABRICATED THEREBY

RELATED APPLICATION

The present application is based on, and claims priority from, Korean Application Number 2004-64535, filed Aug. 17, 2004, the disclosure of which is hereby incorporated by reference herein in its entirety.

BACKGROUND OF THE INVENTION

1. Field of the Invention

The present invention relates to a Light Emitting Diode (LED), and in particular, to a fabrication method of LEDs incorporating a step of surface-treating a substrate by a laser and an LED fabricated by such a fabrication method. More particularly, the present invention can use a laser in order to implement finer surface treatment to an LED substrate over the prior art thereby improving the light extraction efficiency of an LED while protecting the substrate from chronic problems of the prior art such as stress or defects induced from chemical etching and/or physical polishing.

2. Description of the Related Art

In general, nitride semiconductors such as InAlGaN are widely used for Light Emitting Diodes (LEDs) for realizing blue or green light. The nitride semiconductors have a representative formula $Al_xIn_yGa_{(1-x-y)}N$, wherein $0 \leq x \leq 1$, $0 \leq y \leq 1$, $0 \leq x+y \leq 1$. A nitride semiconductor is fabricated by growing nitride epitaxial layers including an n-cladding layer, an active layer and a p-cladding layer on a substrate of for example sapphire via Metal Organic Chemical Vapor Deposition (MOCVD).

The light emitting efficiency of an LED is determined by an internal quantum efficiency, which represents light quantity generated by the LED with respect to external voltage, and an external quantum efficiency, which is measured outside the LED. Herein external quantum efficiency is expressed by the multiplication of internal quantum efficiency with light extraction efficiency. Therefore, it is essential to improve not only internal quantum efficiency but also external quantum efficiency in order to raise the light efficiency of the LED. In general, internal quantum efficiency is determined by active layer structure and epitaxy layer quality, and external quantum efficiency is determined by material refractivity and surface flatness.

Flip-chip LEDs have been increasing in their use. In a flip-chip LED, light generated from an active layer is emitted to the outside through a substrate of for example sapphire. Therefore, the external quantum efficiency of the flip-chip LED is determined by the interfacial state between a substrate and a buffer layer or an n-cladding layer and the outer surface state of the substrate.

Problems occurring in such a flip-chip LED will be described with reference to FIG. 1. As shown in FIG. 1, a fabrication process of a flip-chip LED 10 includes growing an n-GaN layer 14, an active layer 16 and a p-GaN layer 18 in their order on a substrate 12 for example sapphire and then etching a resultant structure into a mesa structure to expose a partial area of the n-GaN layer 14. Then, a p-electrode 20 is formed on the p-GaN layer 18, and an n-electrode 22 is formed on the exposed partial area of the n-GaN layer 14. Preferably, the p-electrode 20 is designed to cover the p-GaN layer 18 as large as possible so as to reflect light generated by the active layer 16 toward the sapphire substrate 12. The p-electrode 20 is properly made of Ag or Al having high reflectivity, and more preferably, made of Ag. The completed LED 10 having the electrodes 20 and 22 is mounted on a board via solder bumps 24 and 26 made of conductive paste, and electrically connected with patterns of the board.

However, such a flip-chip LED 10 has following problems. As shown in FIG. 1, when a light beam L1 is introduced into the sapphire substrate 12 directly from the active layer 16 or after reflecting from the p-electrode 20, total internal reflection takes place to the light beam L1 in a predetermined angle range owing to the refractivity difference between the n-GaN layer 14 and the sapphire substrate 12. Then, the light beam L1 is reflected several times between the sapphire substrate 12 and the reflective layer of p-electrode 20. In this way, the light beam L1 is absorbed and extinguished by the p- and n-GaN layers 14 and 18. This as a result causes light loss thereby to lower the light extraction efficiency and thus the external quantum efficiency of the flip-chip LED 10.

Various approaches have been proposed to solve these problems related with the light loss of such flip-chip LED 10. Representative examples may include Japan Patent Application Publication No. 2002-164296, (United States Patent Application Publication Nos. 2004-0038049 and 2004-0048471 both claiming the benefit of Japan Patent Application Publication No. 2002-164296) and Japan Patent Application Publication No. 2002-280611 (Unites States Patent Application Publication No. 2004-0113166 claiming the benefit of Japanese Patent Application Publication No. 2002-280611). These documents propose in common to roughen the interface between a substrate and an n-GaN layer in order to reduce light loss induced from the refractivity difference between the substrate and the n-GaN layer.

However, these approaches produce a roughened structure in common through chemical etching and thus disadvantageously have a difficulty in realizing a fine geometry. Since a substrate for example of sapphire is resistant to etching, harsh etching conditions are necessary. Under the harsh etching conditions, a photoresist having a pattern corresponding to a desired roughened geometry is also etched. As a result, those etching techniques using photoresists can hardly form fine surface geometries for example of pore or pillar size under 1 µm in substrates. Of course, it is much more difficult to uniformly produce a fine roughened geometry.

As another drawback of the above approaches, defects such as etching stress exist on the top of the roughened structure.

As a result, such etching-associated drawbacks cause nonuniform lighting to the flip-chip LED while degrading the efficiency thereof. In addition, substrates produced according to the above approaches need an additional process such as photolithography and dry etching to increase the entire process time thereby raising cost.

In the meantime, the flip-chip LED also has a following light loss problem, which will be described with reference to FIG. 2 as follows.

A flip-chip LED 10 shown in FIG. 2 has a structure substantially the same as shown in FIG. 1. When a light beam L2 generated in the LED 10 is directed in a predetermined angle range toward a sapphire substrate 12 instead of a p-electrode 20 functioning as a reflecting surface, the light beam L2 is reflected from the sapphire substrate 12 via total internal reflection owing to the refractivity difference between the sapphire substrate 12 and the air or external sealant such as silicone and resin. Then, the light beam L2 is reflected several times between the sapphire substrate 12 and the p-electrode 20. In this way, the light beam L2 is absorbed and extinguished by the sapphire substrate 12 and the n- and p-Gan layers 14 and 18. This as a result causes light loss to reduce the light extraction efficiency of the flip-chip LED 10 and thus the external quantum efficiency thereof.

Although it is desired to impart a roughened structure to the outer surface of the sapphire substrate 12 in order to overcome such a problem, a suitable approach has not been proposed up to the present. More specifically, a fabrication process of the LED 10 polishes the substrate 12 with a grinder containing for example diamond slurry to reduce the thickness thereof after forming the electrodes 20 and 22, and thus the outer surface of the substrate 12 can be roughened after the polishing. However, the foregoing etching cannot be performed to form the roughened structure in the outer surface after the formation of the semiconductor layers 12 to 18 and the electrodes 20 and 22.

SUMMARY OF THE INVENTION

The present invention has been made to solve the foregoing problems of the prior art and it is therefore an object of the present invention to provide a fabrication method of LEDs incorporating a step of surface-treating a substrate by a laser to implement finer surface treatment to an LED substrate over the prior art, thereby improving the light extraction efficiency of an LED while protecting the substrate from chronic problems of the prior art such as stress or defects induced from chemical etching and/or physical polishing.

It is another object of the present invention to provide an LED produced by the above fabrication method.

According to an aspect of the present invention for realizing the object, there is provided a fabrication method of Light Emitting Diodes (LEDs) comprising the following steps of: (a) preparing a sapphire substrate; (b) emitting a laser beam onto a first side of the sapphire substrate to form a fine roughened structure; (c) forming an n-doped semiconductor layer, an active layer and a p-semiconductor layer in their order on the roughened side of the sapphire substrate; (d) etching a resultant structure obtained in the step (c) into a mesa structure to expose a partial area of the n-doped semiconductor layer; and (e) forming a p-electrode on the p-doped semiconductor layer and an n-electrode on the exposed area of the n-doped semiconductor layer.

The fabrication method of the invention may further comprise the steps of: (f) polishing a second side of the substrate to reduce the thickness of the substrate after the step (e); and (g) emitting a laser beam onto the second side of the substrate to form a fine roughened structure therein.

According to another aspect of the present invention for realizing the object, there is provided a fabrication method of Light Emitting Diodes (LEDs) comprising the following steps of: (a) preparing a sapphire substrate; (b) forming a fine roughened structure in a first side of the sapphire substrate; (c) forming an n-doped semiconductor layer, an active layer and a p-doped semiconductor layer in their order on the roughened sapphire substrate; (d) etching a resultant structure obtained in the step (c) into a mesa structure to expose a partial area of the n-doped semiconductor layer; (e) forming a p-electrode on the p-doped semiconductor layer and an n-electrode on the exposed area of the n-doped semiconductor layer; (f) polishing a second side of the substrate to reduce the thickness of the substrate; and (g) illuminating a laser beam onto the second side of the substrate to form a fine roughened structure therein.

In the fabrication method of the invention, the step (b) preferably comprises illuminating a laser beam onto the first side of the substrate to form the fine roughened structure therein.

In the foregoing fabrication methods of the invention, the step (b) of forming a fine roughened structure may comprise loading the substrate on a movable pedestal with the first side thereof facing upward, moving the movable pedestal at a predetermined rate, emitting the laser beam from a laser source, and opening a shutter on the path of the laser beam between the laser source and the substrate to form a groove at the movement of the pedestal to a predetermined pitch.

The step (b) of forming a fine roughened structure may comprise loading the substrate on a movable pedestal with the first side thereof facing upward, placing a mask having a number of holes matching the roughened structure above the substrate, and emitting the laser beam from a laser source above the mask onto the substrate so that the laser beam illuminates the first side of the substrate through the holes of the mask.

The step (b) of forming a fine roughened structure may comprise loading the substrate on a movable pedestal with the first side thereof facing upward, and moving the pedestal while emitting the laser beam onto the first side of the substrate, the laser beam having a diameter less than a groove in the roughened structure.

In addition, the step (b) of forming a fine roughened structure may comprise loading the substrate on a pedestal with the first side thereof facing upward and emitting the laser beam onto the first side of the substrate while moving a laser source, the laser beam having a diameter less than a groove formed in the roughened structure.

In the foregoing fabrication methods of the invention, the sapphire substrate may be replaced by one selected from the group consisting of a SiC substrate, an oxide substrate and a carbide substrate.

According to further another aspect of the present invention for realizing the object, there is provided an LED produced by the foregoing methods, comprising: a sapphire substrate having a fine roughened structure formed in a first side thereof, the fine roughened structure being formed via laser illumination; an n-doped semiconductor layer formed on the roughened first side of the substrate; an active layer and a p-doped semiconductor layer formed in their order on the n-doped semiconductor layer to expose a partial area of the n-doped semiconductor layer; a p-electrode formed on the p-doped semiconductor layer; and an n-electrode formed on the exposed area of the n-doped semiconductor layer.

In the LED of the invention, the sapphire substrate preferably has a second side polished to reduce the thickness of the sapphire substrate and a fine roughened structure formed in a second side via laser illumination.

According to yet another aspect of the present invention for realizing the object, there is provided an LED produced by the foregoing methods, comprising: a sapphire substrate having a first side having a fine roughened structure formed therein and a second side having a fine roughened structure formed therein via laser illumination; an n-doped semiconductor layer formed on the roughened first side of the sapphire substrate; an active layer and a p-doped semiconductor layer formed in their order on the n-doped semiconductor layer to expose a partial area of the n-doped semiconductor layer; a p-electrode formed on the p-electrode layer; and an n-electrode formed on the exposed area of the n-doped semiconductor layer.

In the LED of the invention, the fine roughened structure in the first side of the substrate is preferably formed via laser illumination.

In the foregoing LEDs of the invention, the sapphire substrate may be replaced by one selected from the group consisting of a SiC substrate, an oxide substrate and a carbide substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
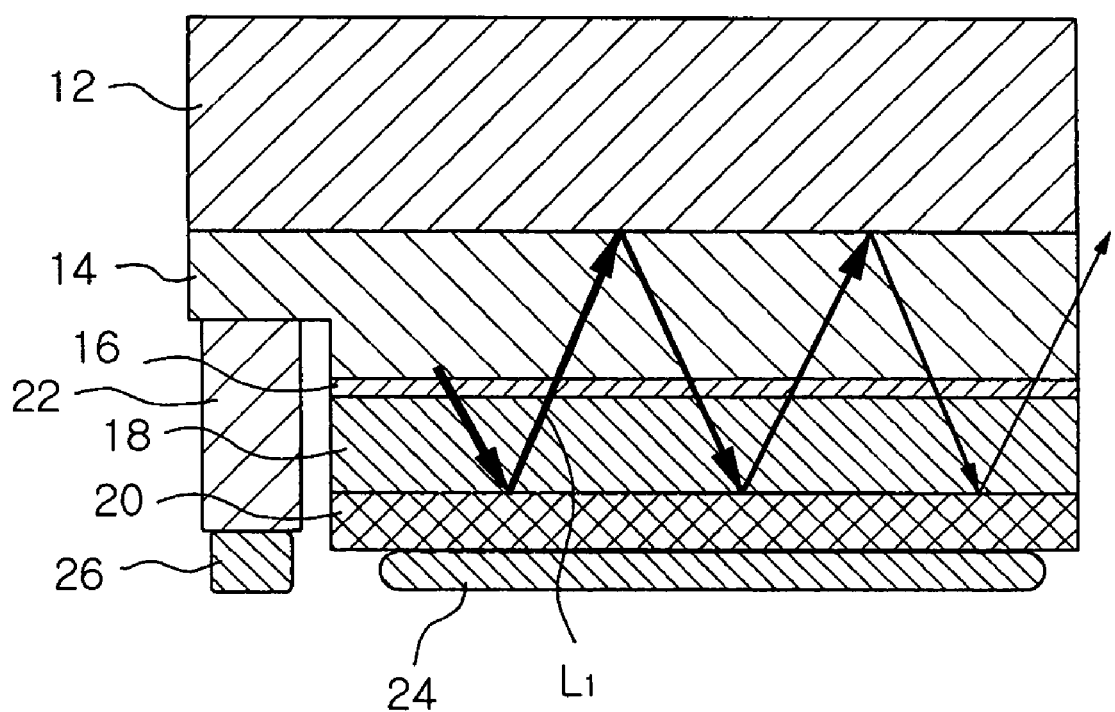
FIGS. 1 and 2 are cross-sectional views illustrating light loss generating in conventional flip-chip LEDs.
Figure 2:
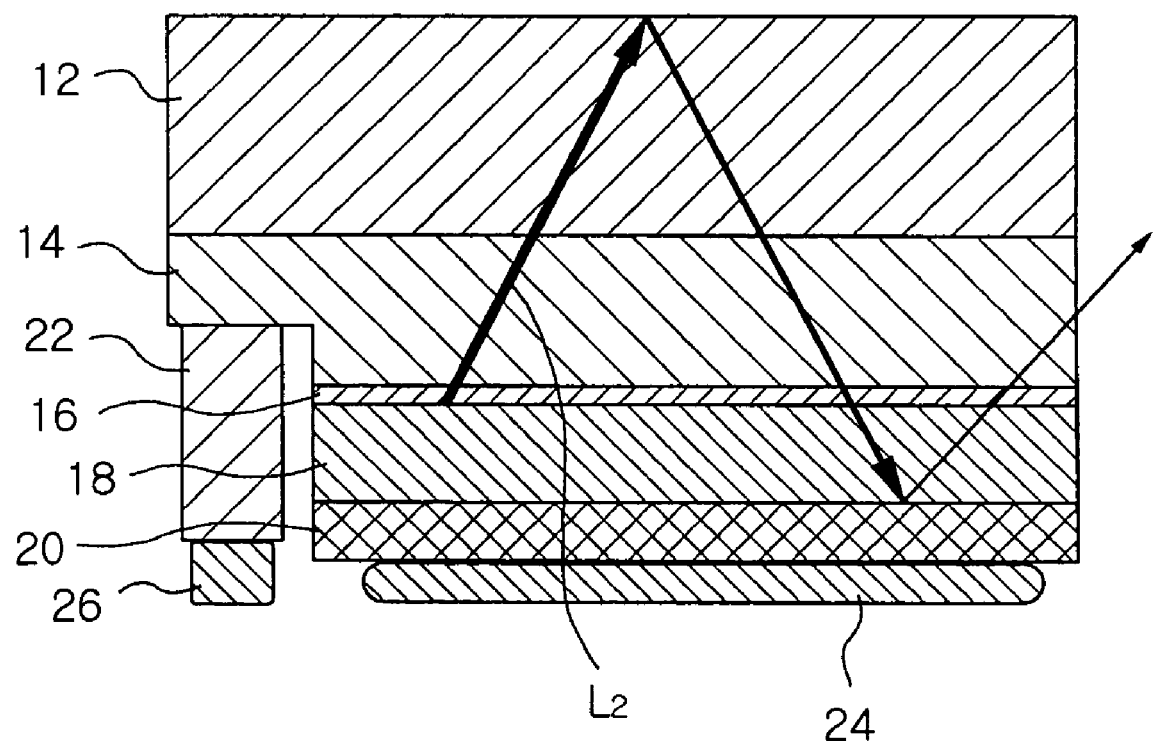
Figure 3:
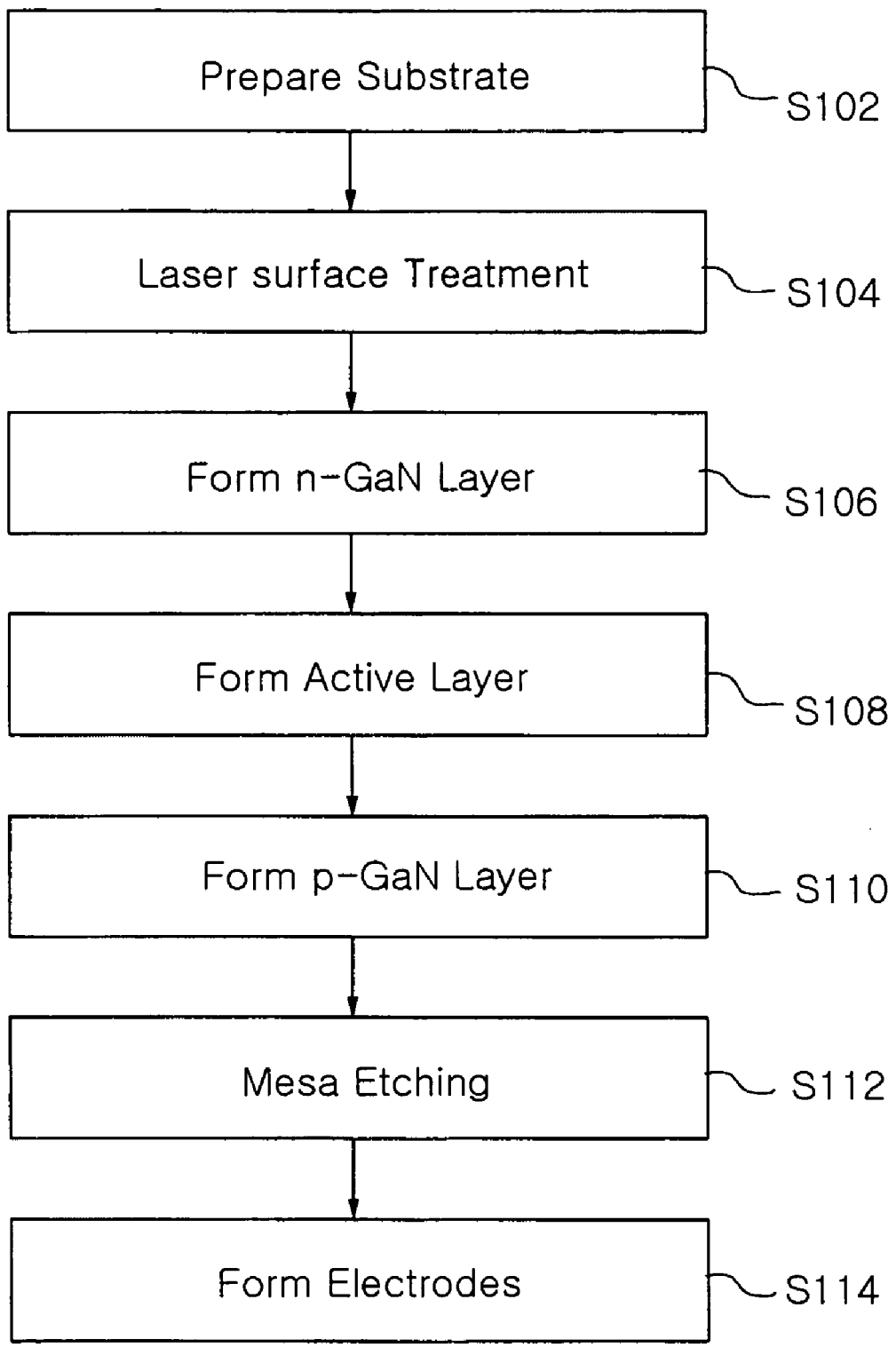
FIG. 3 is a flowchart of an LED fabrication method according to a first embodiment of the present invention.

FIG. 3 is a flowchart of an LED fabrication method according to a first embodiment of the present invention. Referring to FIG. 3, a substrate of for example sapphire is prepared in S102, and a laser beam is emitted onto one side of the sapphire substrate to form a fine roughened structure in S104. Then, semiconductor layers including an n-GaN layer, an active layer and a p-GaN layer are formed in succession on the roughened surface of the sapphire substrate in S106, S108 and S110, and a resultant structure is etched into a mesa structure in S112. Then, a p-electrode is formed on the p-GaN layer and an n-electrode is formed on an exposed partial area of the n-GaN layer to complete an LED in S114.

In order to form a fine roughened structure in the substrate surface, the present invention can utilize various lasers including 308 nm, 428 nm and 198 nm Excimer lasers, an Nd:YAG laser (YAG is the short form of Yttrium Aluminum Garnet), a He—Ne laser and an Ar-ion laser. These lasers can easily form a micro-pattern by focusing a laser beam on a desired spot, in which the laser beam can produce a roughened structure more precisely in inverse proportional to its wavelength. Therefore, when the laser beam is illuminated onto one side of the substrate, the width and intensity of the laser beam is adjusted according to the physical property of the sapphire and the dimension of a wanted surface structure to be roughened so that grooves having a desired dimension can be formed in the surface of the substrate thereby to impart a fine roughened structure to the entire substrate surface.

The above process can adjust the width of the illuminating laser beam to uniformly form the roughened structure, in which grooves have a width of 1 μm or less. In addition, even though formed at such a fine dimension, the roughened structure or the grooves do not cause stress to a top portion of the roughened structure so that an LED of high quality can be produced.

In addition, the sapphire substrate can be replaced with a SiC substrate, an oxide substrate or a carbide substrate.

Figure 4:
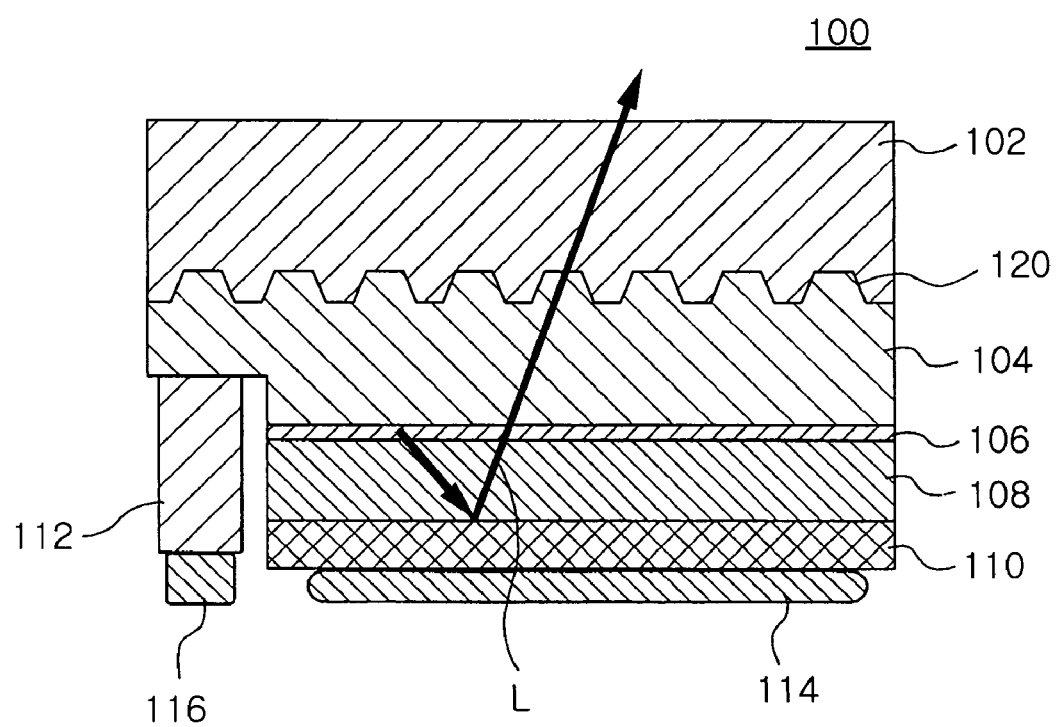
FIG. 4 is a cross-sectional view of an LED produced by the LED fabrication method according to the first embodiment of the present invention.

FIG. 4 is a cross-sectional view of an LED produced by the LED fabrication method according to the first embodiment of the present invention. Referring to FIG. 4, an LED of this embodiment includes a sapphire substrate 102 having a fine roughened structure 120, which is formed on one side of the sapphire substrate 102 via a laser beam, an n-GaN layer 104 formed on the roughened surface of the sapphire substrate 102, an active layer 106 formed on the n-GaN layer 104 to expose a partial area of the n-GaN layer 104, a p-GaN layer 108 formed on the active layer 106, a p-electrode 110 formed on the p-GaN layer 108 and an n-electrode 112 formed on the exposed area of the n-GaN layer 106. Preferably, the p-electrode 110 is designed to cover the p-GaN layer 108 as large as possible so as to reflect light generated by the active layer 106 toward the sapphire substrate 102. The p-electrode 110 is properly made of Ag or Al having high reflectivity, and more preferably, made of Ag. In addition, solder bumps 114 and 116 are formed on the p- and n-electrodes 110 and 112, respectively, to mount the LED 100 on a board while electrically connecting the LED 100 to patterns of the board.

The fine roughened structure 120 formed in one side of the sapphire substrate 102 has a merit as follows: When the LED 100 of this embodiment generates light, even though a light beam L is introduced toward the sapphire substrate 102 directly from the active layer 106 or upon reflecting from the p-electrode 110 in the range of total internal reflection angle, the roughened structure 120 allows the light beam L to propagate from the n-GaN layer 104 into the sapphire substrate 102 without reflection and then radiate to the outside.

In addition, although it has been described that the foregoing semiconductor layer is made of GaN, the semiconductor layer also may be made of ZnSe.

Figure 5:
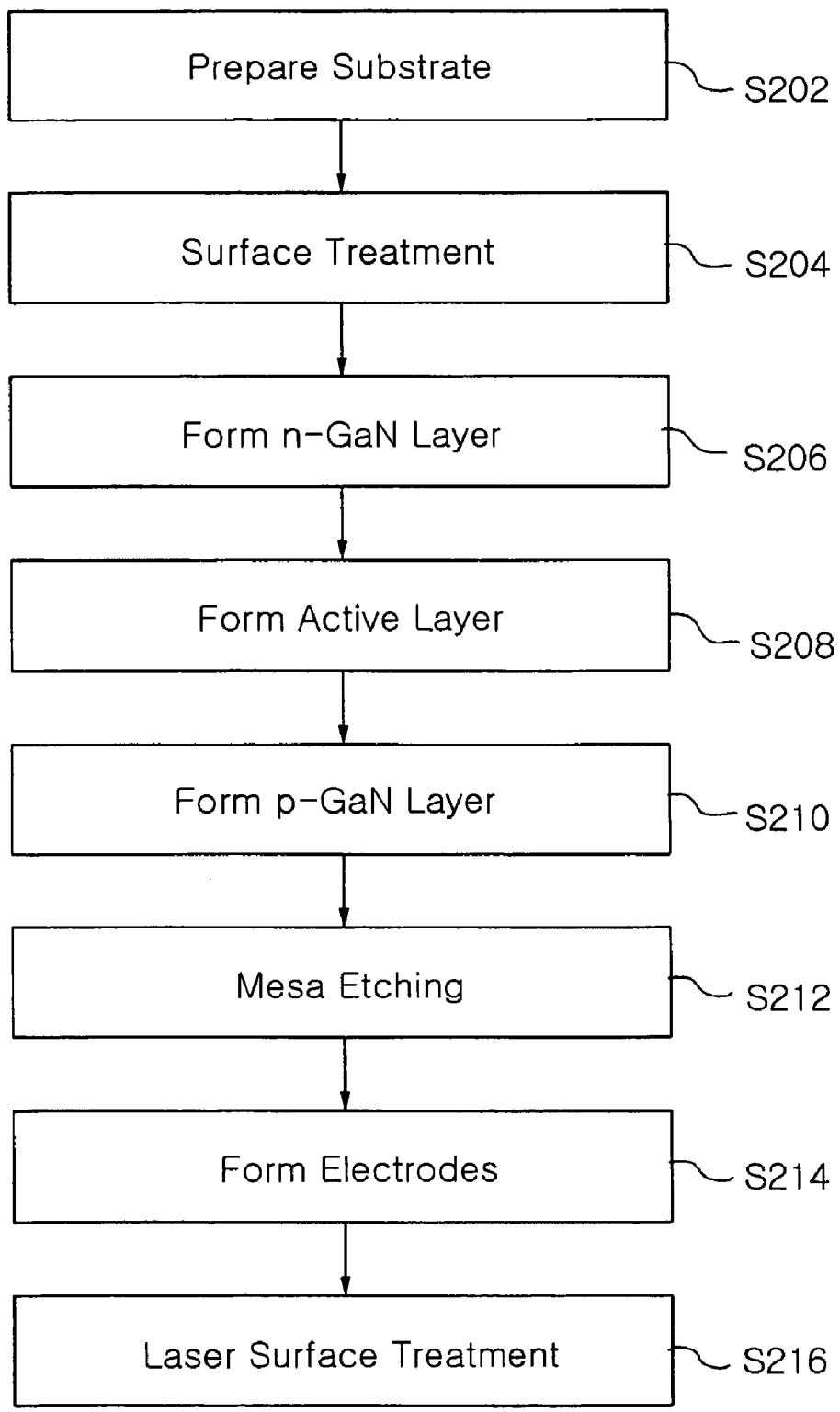
FIG. 5 is a flowchart of an LED fabrication method according to a second embodiment of the present invention.

FIG. 5 is a flowchart of an LED fabrication method according to a second embodiment of the present invention. Referring to FIG. 5, a substrate of for example sapphire is prepared in S202, one side of the sapphire substrate is pre-treated in S204, a plurality of semiconductor layers including n-GaN, active and p-GaN layers are formed in their order on the treated side of the sapphire substrate in S206, S208 and S210, and a resultant structure is mesa-etched to expose a partial area of the n-GaN layer in S212. A p-electrode is formed on the p-GaN layer and an n-GaN layer is formed on the exposed area of the n-GaN layer in S214. Then, the sapphire substrate is polished at the other side with a grinder containing for example diamond slurry to reduce the thickness of the sapphire substrate and then a laser beam is illuminated onto the other side of the sapphire substrate to form a fine roughened structure in S216.

In order to form a fine roughened structure in the substrate surface, this embodiment can utilize various lasers including 308 nm, 428 nm and 198 nm Excimer lasers, an Nd:YAG laser, a He—Ne laser and an Ar-ion laser. These lasers can easily form a micro-pattern by focusing a laser beam on a desired spot, in which the laser beam can produce a roughened structure more precisely in inverse proportional to its wavelength. Therefore, when the laser beam is illuminated onto one side of the substrate, the width and intensity of the laser beam is adjusted according to the physical property of the sapphire and the dimension of a wanted surface structure to be roughened so that grooves having a desired dimension can be formed in the surface of the substrate thereby to impart a fine roughened structure to the entire substrate surface.

The above process can adjust the width of the illuminating laser beam to uniformly form the roughened structure with grooves having a fine width preferably of 1 μm or less. Therefore, laser beam illumination can be performed after the polishing of the sapphire substrate so that the roughened structure can be easily formed in the other side or outer surface of the sapphire substrate unlike the prior art. As a result, this can solve those problems of the prior art in which light loss takes place to lower the light extraction efficiency of an LED and thus the external quantum efficiency thereof.

In addition, the sapphire substrate can be replaced with a SiC substrate, an oxide substrate or a carbide substrate.

Figure 6:
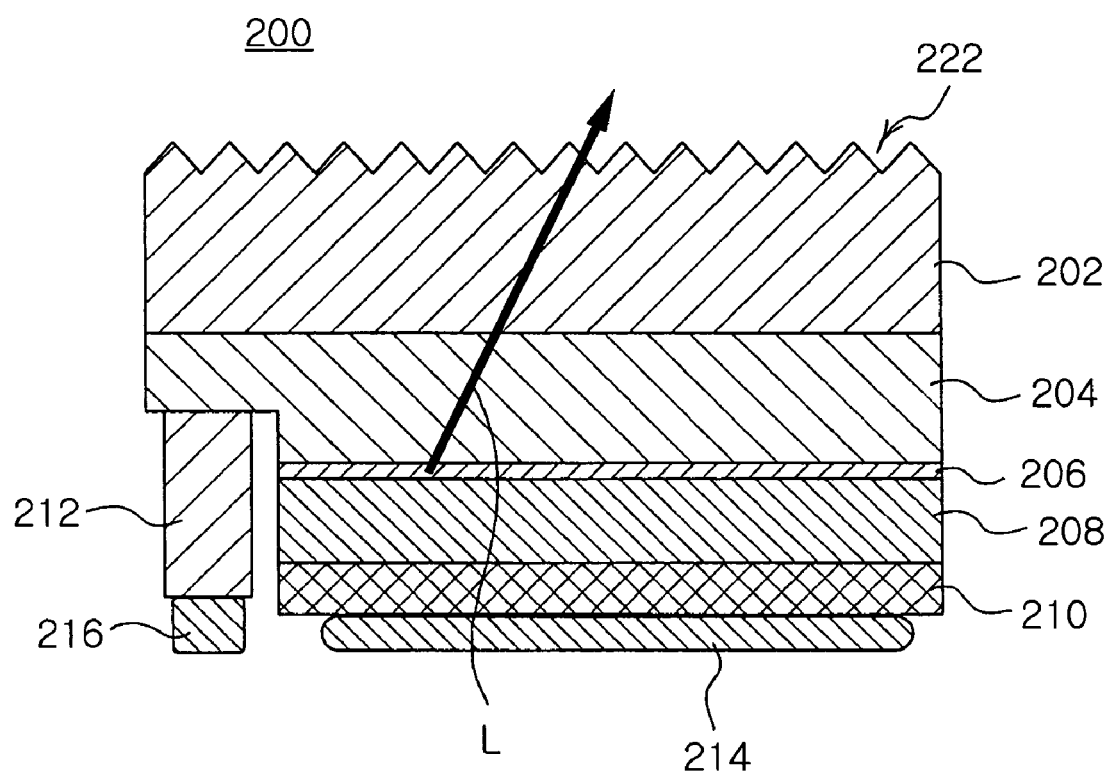
FIG. 6 is a cross-sectional view of an LED produced by the LED fabrication method according to the second embodiment of the present invention.

FIG. 6 is a cross-sectional view of an LED produced by the LED fabrication method according to the second embodiment of the present invention. Referring to FIG. 6, the LED 200 of this embodiment includes a sapphire substrate 202 having a fine roughened structure 222, which is formed in an outer surface by a laser beam, an n-GaN layer 204 formed on an inner surface of the sapphire substrate 202, an active layer 206 formed on the n-GaN layer 204 to expose a partial area of the n-GaN layer 204, a p-GaN layer 208 formed on the active layer 206, a p-electrode 210 formed on the p-GaN layer 208 and an n-electrode 212 formed on the exposed area of the n-GaN layer 204. Preferably, the p-electrode 210 is designed to cover the p-GaN layer 208 as large as possible so as to reflect light generated by the active layer 206 toward the sapphire substrate 202. The p-electrode 210 is properly made of Ag or Al having high reflectivity, and more preferably, made of Ag. In addition, solder bumps 214 and 216 made of conductive paste are provided on the p- and n-electrodes 210 and 212, respectively, to mount the LED 200 on a board as well as electrically connecting the LED 200 to patterns of the board.

The fine roughened structure 220 formed in the outer surface of the sapphire substrate 202 has a merit as follows: When the LED 200 of this embodiment generates light, even though a light beam L propagates to the outside from the outer surface of the sapphire substrate 202 directly from the active layer 206 or upon reflecting from the p-electrode 210 in the range of total internal reflection angle, the roughened structure 222 allows the light beam to radiate from the sapphire substrate 202 to an ambient air layer or a sealant such as silicone or resin without total internal reflection. As a result, this LED structure can prevent the light loss of the prior art in which light reflects from the outer surface of the sapphire substrate 202 into the LED 200 owing to the refractivity difference between the outer surface of the sapphire substrate 202 and the foreign material (e.g., the air and sealant).

Figure 7:
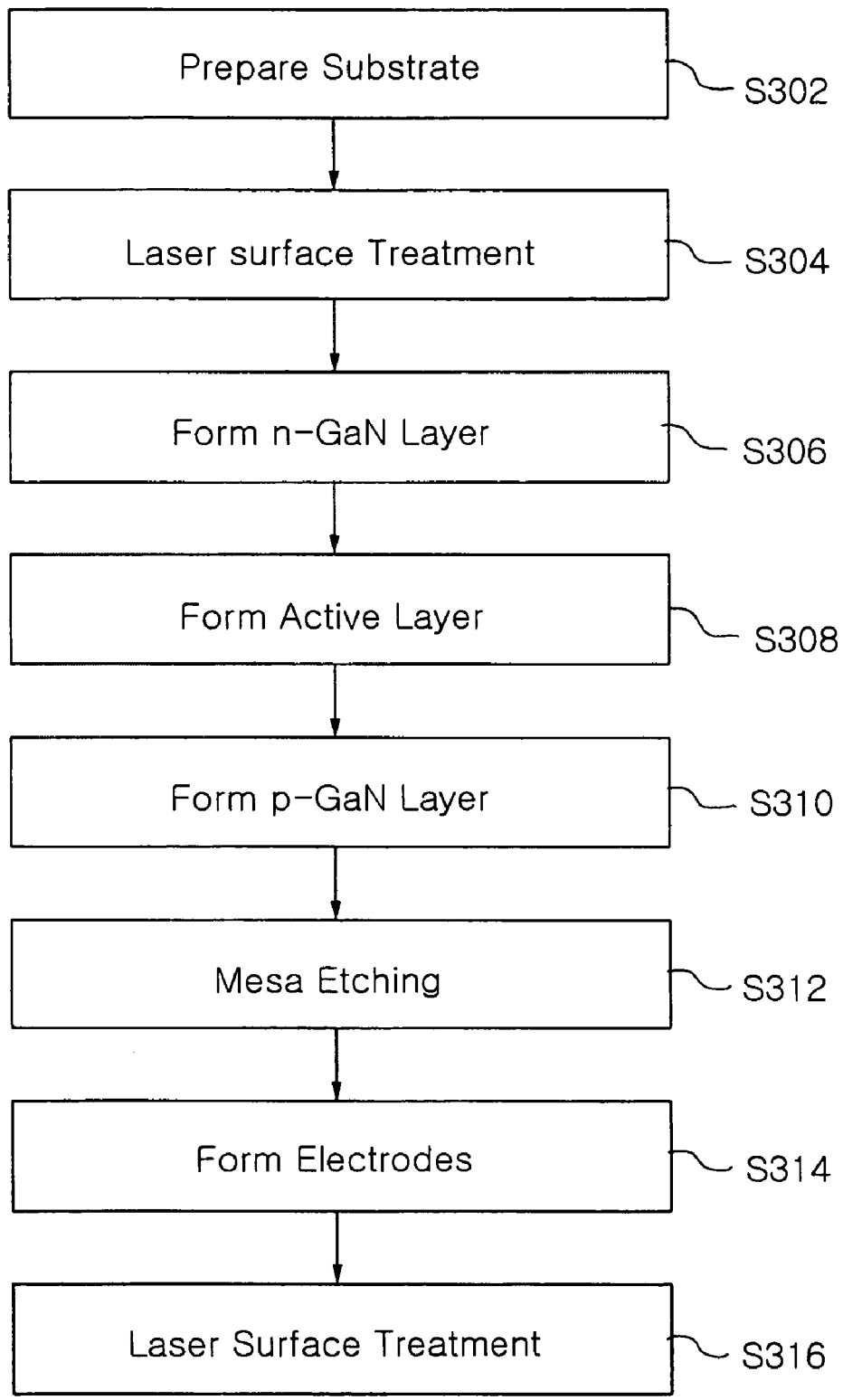
FIG. 7 is a flowchart of an LED fabrication method according to a third embodiment of the present invention.

FIG. 7 is a flowchart of an LED fabrication method according to a third embodiment of the present invention. Referring to FIG. 7, a substrate of for example sapphire is prepared in S302, a laser beam is emitted onto one side of the sapphire substrate to form a fine roughened structure in S304, an n-GaN layer, an active layer and a p-GaN layer are formed in their order on the roughened side of the sapphire substrate in S306, S308 and S310, and a resultant structure is mesa-etched to expose a partial area of the n-GaN layer in S312. A p-electrode is formed on the p-GaN layer and an n-electrode is formed on the exposed area of the n-GaN layer in S314. Then, the sapphire substrate is polished at the other side with a grinder containing for example diamond slurry to reduce the thickness of the sapphire substrate and then a laser beam is emitted onto the other side of the sapphire substrate to form a fine roughened structure in S316.

In this embodiment, the process steps of forming the fine roughened structures in both sides, that is, the inner and outer surfaces of the sapphire substrate are substantially the same as those in the foregoing first and second embodiments, and thus they will not be described further.

Figure 8:
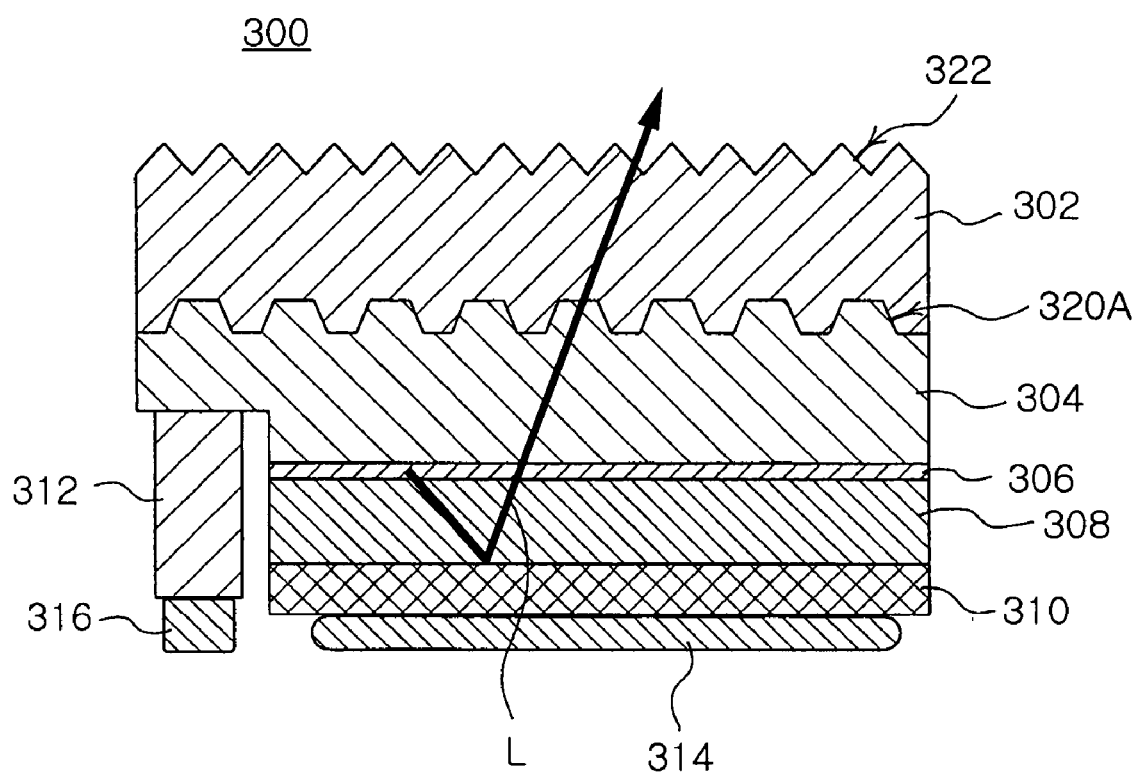
FIG. 8 is a cross-sectional view of an LED produced by the LED fabrication method according to the third embodiment of the present invention.

FIG. 8 is a cross-sectional view of an LED produced by the LED fabrication method according to the third embodiment of the present invention. Referring to FIG. 8, an LED 300 of this embodiment has technical features discriminated from the LEDs 100 and 200 of the first and second embodiments in that fine roughened structures 320 and 322 are formed in both sides, that is, inner and outer surfaces of a sapphire substrate 320 via laser beams.

When formed via the laser beams in one side of the sapphire substrate 302 on which the n-GaN layer 302 is grown, the fine roughened structure 320 can prevent total internal reflection between the substrate 302 and the n-GaN layer 302 to reduce light loss while reducing defects such as stress therein as previously described in the first embodiment in conjunction with FIGS. 3 and 4. In addition, the fine roughened structure 322 formed via the laser beams in the outer surface of the sapphire substrate 302 in contact with foreign material (e.g., the air and sealant) can prevent the loss of light L in the LED 300 by substantially removing the total internal reflection between the sapphire substrate 302 and the foreign material. As a result, the fine roughened structures 320 and 322 formed in the inner and outer surfaces of the substrate 302 can reduce light loss and therefore further improve light extraction efficiency.

Hereinafter several examples for forming a fine roughened structure in a sapphire substrate of an LED according to the present invention will be discussed with reference to FIGS. 9 to 11.

Figure 9:
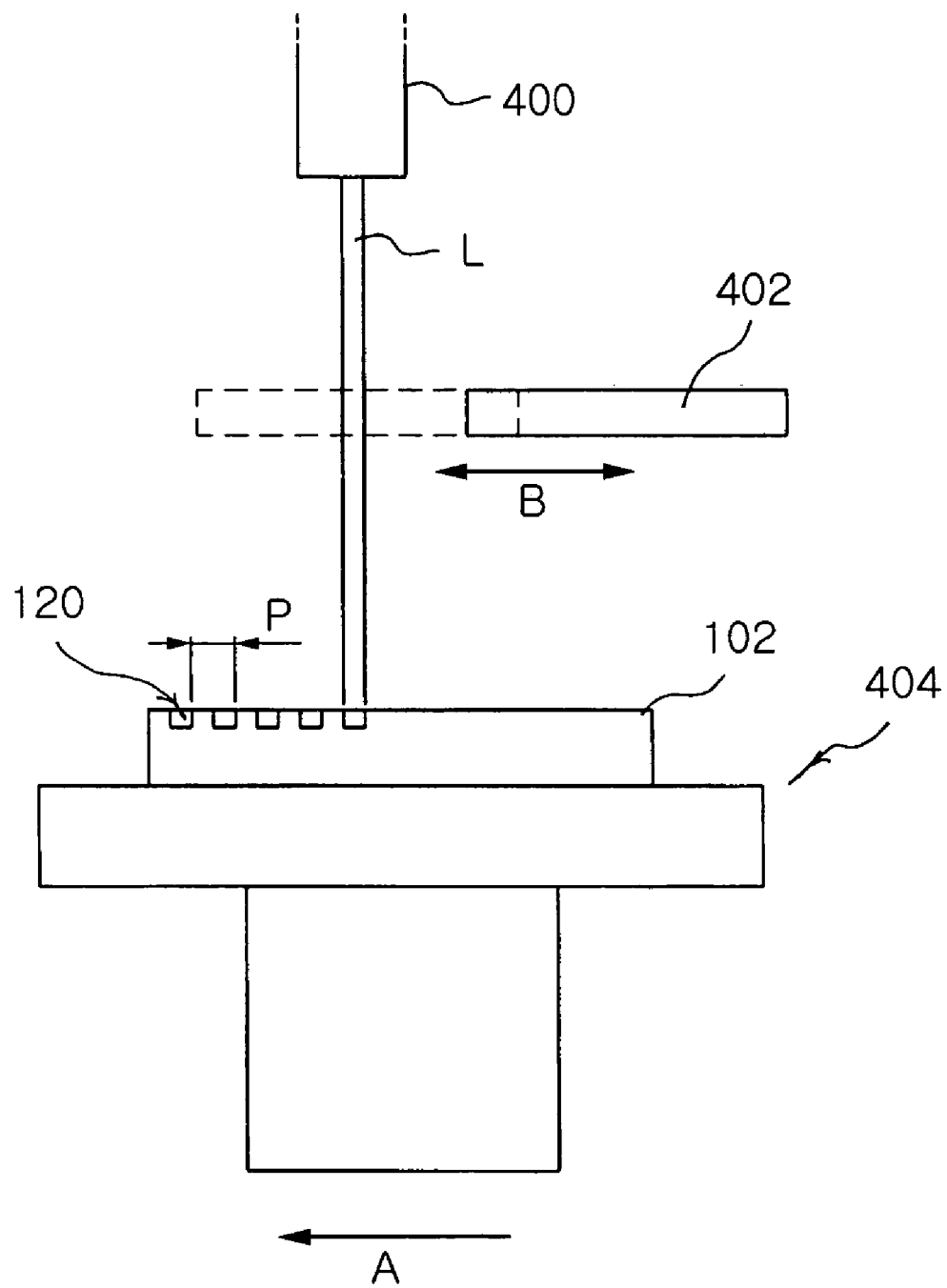
FIGS. 9 to 11 are perspective views of apparatuses for forming a fine roughened structure on a sapphire substrate of an LED according to the present invention.

A laser system shown in FIG. 9 includes a laser source 400, a shutter 402 and a movable pedestal 404. The movable pedestal 404 serves to load a sapphire substrate 102, and is designed to move at a predetermined rate in the direction of an arrow A and/or other directions.

The laser source 400 is designed to emit a fine laser beam L for forming a fine roughened structure 120 in the sapphire substrate 102 to a predetermined width and depth. The shutter 402 is placed on the path of a laser beam L between the laser source 400 and the sapphire substrate 102 (as represented with a dotted line), and moves to a position drawn with a solid line in the direction of an arrow B whenever the movable pedestal 404 loaded with the sapphire substrate 102 moves to a predetermined pitch or a length so that the laser beam L can form grooves of the fine roughened structure 102 in the sapphire substrate 102. As a result, this operation forms alternating grooves and protrusions in the sapphire substrate 102 at a predetermined gap. That is to say, every pair of groove and protrusion are formed corresponding to a single pitch. Repeating this process can form a number of grooves and protrusions and therefore embody the fine roughened structure 120 to the sapphire substrate 102.

In this case, available examples of the laser source may include 308 nm, 428 nm and 198 nm Excimer lasers, an Nd:YAG laser, a He—Ne laser and an Ar-ion laser. In addition, the sapphire substrate can be replaced with a SiC substrate, an oxide substrate or a carbide substrate.

Figure 10:
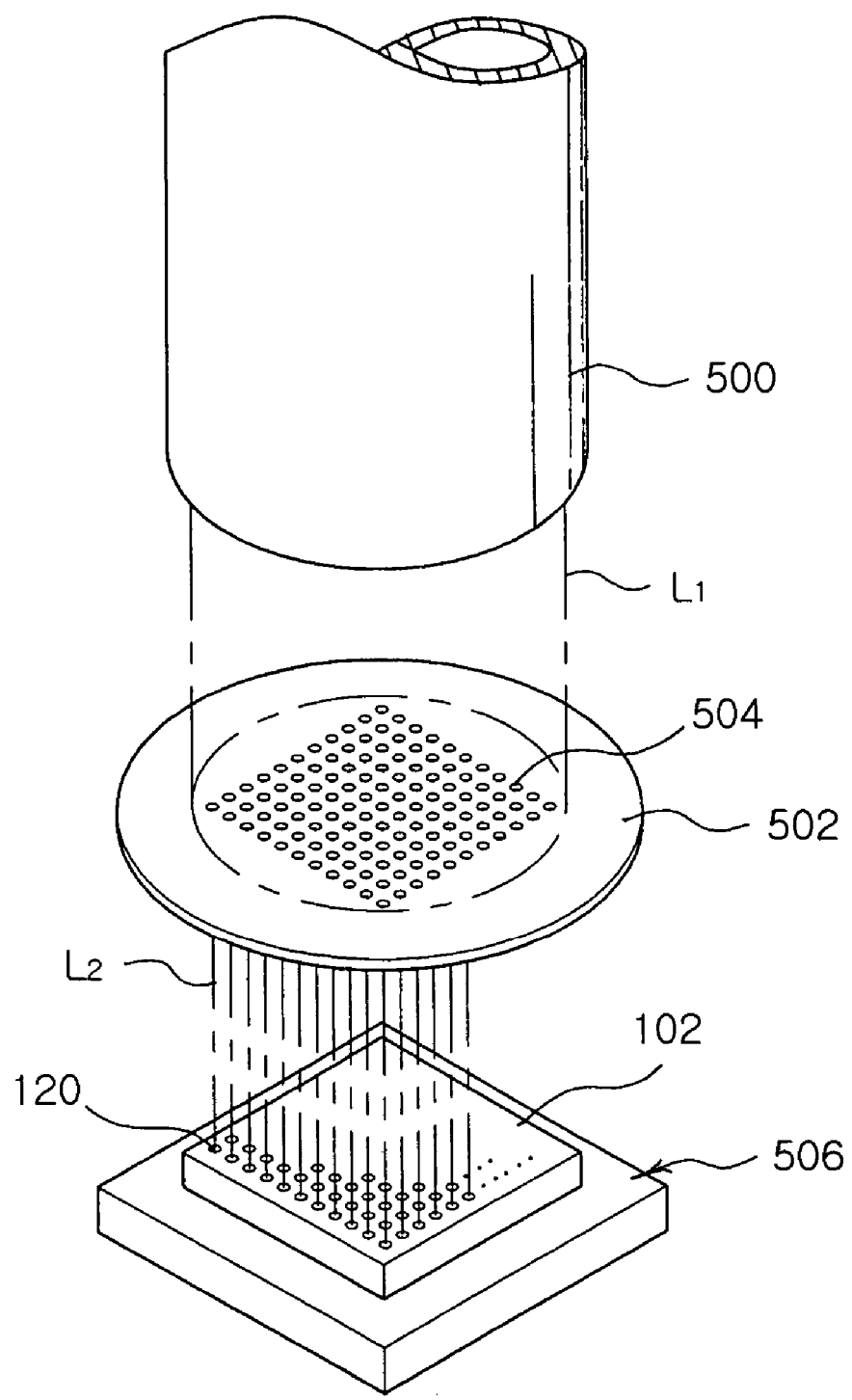

A laser system shown in FIG. 10 includes a laser source 500 capable of emitting a large area laser beam L1, a mask 502 having a number of fine holes 504 of a desired diameter or width and a desired interval and a pedestal 506 for loading a sapphire substrate 102 thereon.

The laser source 500 is designed to emit the laser beam L1 capable of illuminating the entire are of the sapphire substrate 102, and the holes 502 of the mask 502 are arrayed in an outline matching the upper surface of the sapphire substrate to covert the laser beam L1 into a number of fine laser beams L2 of a desired diameter or width and a desired interval. Then, the fine laser beams L2 are emitted onto the upper surface of the sapphire substrate 102 to impart a fine roughened structure 120 including a number of grooves of a desired diameter or width and a desired interval to the upper surface of the sapphire substrate 102.

While the laser source applicable to this system is substantially the same as previously described in conjunction with FIG. 9, the laser beam L1 is not necessarily intended to illuminate the entire area of the substrate 102 by one time. That is, the laser beam can be adapted to illuminate a partial area of the substrate 102. The laser beam is converted into a number of fine laser beams to impart a fine roughened structure to the partial area of the substrate 102, and then the pedestal 506 or the laser source 500 is moved to repeat the process of forming the fine roughened structure 120 to other areas of the substrate 102.

As described above, available examples of the laser source may include 308 nm, 428 nm and 198 nm Excimer lasers, an Nd:YAG laser, a He—Ne laser and an Ar-ion laser. In addition, the sapphire substrate can be replaced with a SiC substrate, an oxide substrate or a carbide substrate.

Figure 11:
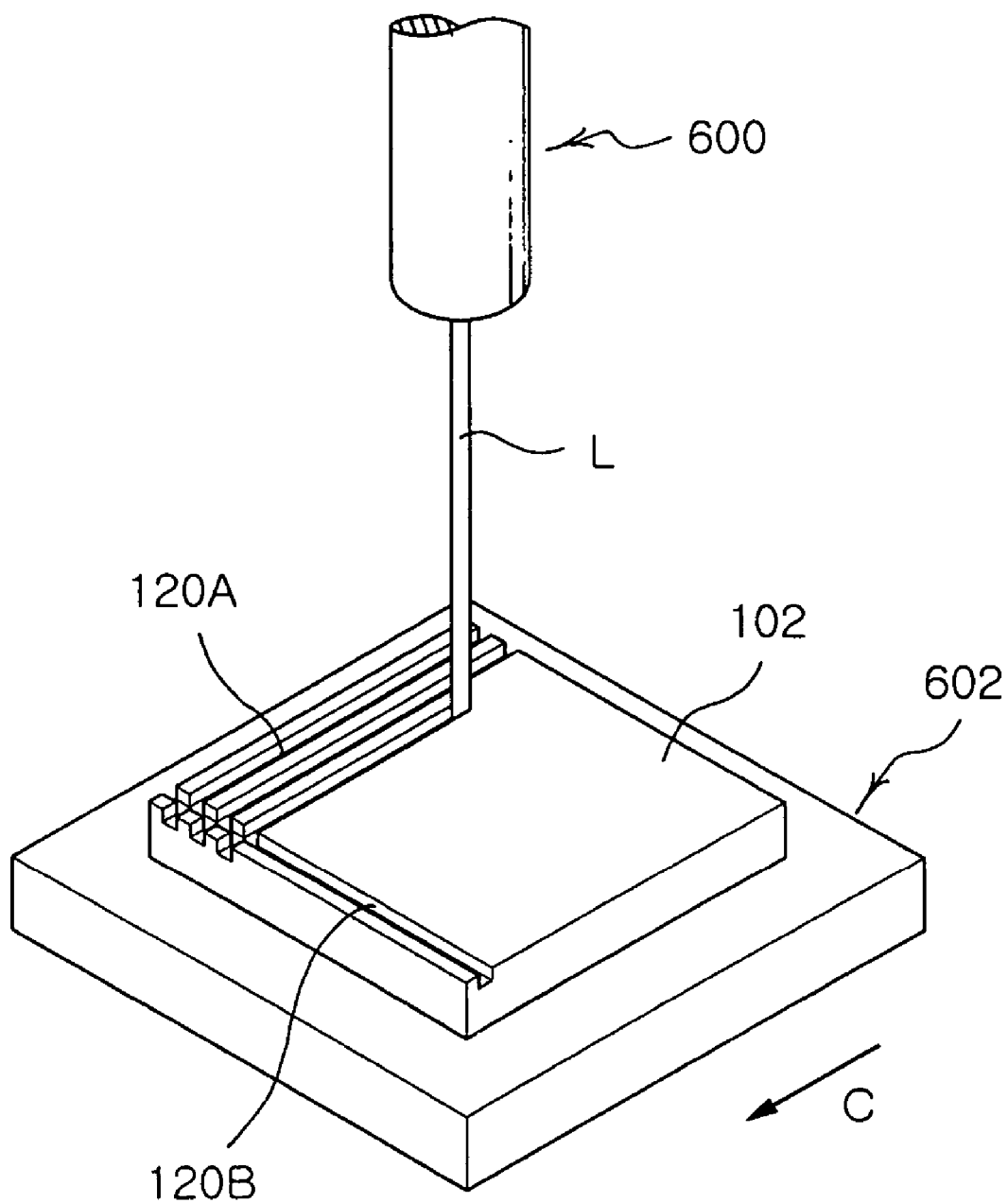

A laser system shown in FIG. 11 includes a laser source 600 and a movable pedestal 602. The movable pedestal 602 is loaded with a sapphire substrate 102 and designed to move in the direction of an arrow C at a predetermined rate. Of course, the pedestal 602 is designed movable in various directions such as a direction crossing the arrow C or a diagonal direction.

As shown in FIG. 11, emitting a laser beam L onto the substrate 102 from laser source 600 while moving the movable pedestal 602 loaded with the sapphire substrate 102 in the direction of the arrow C forms slits 120A in the sapphire substrate 102. Of course, moving the pedestal 602 in a direction perpendicular to the arrow C forms the slits 120B, in which only one slit is shown for the sake of brevity. In this way, the slits 120 and 120 can be formed in one direction or to cross each other in order to form the fine roughened structure desired in the present invention in the surface of the substrate 102.

Alternatively, the slits 120A and 120B can be formed by moving the laser source 600 with respect to the fixed pedestal 602.

As previously described, available examples of the laser source may include 308 nm, 428 nm and 198 nm Excimer lasers, an Nd:YAG laser, a He—Ne laser and an Ar-ion laser. In addition, the sapphire substrate can be replaced with a SiC substrate, an oxide substrate or a carbide substrate.

As described hereinbefore, the present invention can use the laser to implement more fine surface treatment to an LED substrate so as to improve the light extraction efficiency of an LED. In addition, the present invention can protect the substrate from chronic problems of the prior art such as stress and defects induced from chemical etching and/or physical polishing.

While the present invention has been shown and described in connection with the preferred embodiments, it will be apparent to those skilled in the art that modifications and variations can be made without departing from the spirit and scope of the present invention as defined by the appended claims.

What is claimed is:

1. A method of fabricating Light Emitting Diodes (LEDs), comprising the steps of:
   preparing a substrate having opposite first and second sides;
   directing a laser beam onto the first side of the substrate to form a first finely roughened structure on the first side of said substrate;
   forming an n-doped semiconductor layer, an active layer and a p-semiconductor layer in the recited order on the first finely roughened structure of the first side of the substrate to obtain a resultant structure;
   mesa-etching the resultant structure to expose a partial area of the n-doped semiconductor layer;
   forming a p-electrode on the p-doped semiconductor layer and an n-electrode on the exposed area of the n-doped semiconductor layer;
   polishing the second side of the substrate to reduce the thickness of the substrate after the step of forming the p-electrode and the n-electrode; and
   directing a laser beam onto the second side of the substrate to form a second finely roughened structure on the second side of said substrate.

2. The method of claim 1, wherein the first finely roughened structure is formed by
   loading the substrate on a movable pedestal with the first side thereof facing upward,
   moving the movable pedestal at a predetermined rate,
   emitting the laser beam from a laser source, and
   opening a shutter on the path of the laser beam between the laser source and the substrate to form a groove at the movement of the pedestal to a predetermined pitch.

3. The method of claim 1, wherein the first finely roughened structure is formed by
   loading the substrate on a movable pedestal with the first side thereof facing upward,
   placing a mask having a number of holes matching the roughened structure above the substrate, and
   directing the laser beam from a laser source through the holes of the mask onto the first side of said substrate.

4. The method of claim 1, wherein the first finely roughened structure is formed by
   loading the substrate on a movable pedestal with the first side thereof facing upward, and
   moving the pedestal while directing the laser beam onto the first side of the substrate, the laser beam having a diameter less than a width of a groove formed by said laser beam in the first finely roughened structure.

5. The method of claim 1, wherein the first finely roughened structure is formed by
   loading the substrate on a pedestal with the first side thereof facing upward, and
   directing the laser beam emitted by a laser source onto the first side of the substrate while moving the laser source, the laser beam having a diameter less than a width of a groove formed by said laser beam in the roughened structure.

6. The method of claim 1, wherein the substrate is one selected from the group consisting of a sapphire substrate, a SiC substrate, an oxide substrate, and a carbide substrate.

7. The method of claim 1, wherein the second finely roughened structure is formed after said polishing step.

8. The method of claim 1, wherein the laser beam that forms the first finely roughened structure is directed substantially perpendicular to the plane of said substrate.

9. The method of claim 1, wherein the laser beam that forms the second finely roughened structure is directed substantially perpendicular to the plane of said substrate.

* * * * *